US012361992B1

(12) United States Patent
Hunt-Schroeder et al.

(10) Patent No.: US 12,361,992 B1
(45) Date of Patent: Jul. 15, 2025

(54) METHOD AND APPARATUS FOR FASTER BITCELL OPERATION

(71) Applicant: Marvell Asia Pte Ltd, Singapore (SG)

(72) Inventors: Eric D. Hunt-Schroeder, Essex Junction, VT (US); Sundar Sankarasubramanian, Tamil Nadu (IN); Dale Edward Pontius, Colchester, VT (US)

(73) Assignee: MARVELL ASIA PTE LTD, Singapore (SG)

( * ) Notice: Subject to any disclaimer, the term of this patent is extended or adjusted under 35 U.S.C. 154(b) by 147 days.

(21) Appl. No.: 18/194,727

(22) Filed: Apr. 3, 2023

Related U.S. Application Data

(60) Provisional application No. 63/327,786, filed on Apr. 5, 2022.

(51) Int. Cl.
| G11C 7/00 | (2006.01) |
| G11C 7/08 | (2006.01) |
| G11C 7/10 | (2006.01) |
| G11C 7/18 | (2006.01) |
| G11C 7/24 | (2006.01) |

(52) U.S. Cl.
CPC ............... *G11C 7/24* (2013.01); *G11C 7/08* (2013.01); *G11C 7/1069* (2013.01); *G11C 7/18* (2013.01)

(58) Field of Classification Search
CPC ..... G11C 16/3459; G11C 16/08; G11C 16/24; G11C 16/26
USPC .................................................... 365/185.22
See application file for complete search history.

(56) References Cited

U.S. PATENT DOCUMENTS

| 7,545,684 | B2 * | 6/2009 | Nakagawa | G11C 16/12 365/189.09 |
| 7,606,087 | B2 * | 10/2009 | Lee | G11C 7/08 365/207 |
| 7,697,342 | B2 * | 4/2010 | Byeon | G11C 5/145 365/189.11 |
| 7,800,955 | B2 * | 9/2010 | Won | G11C 16/3454 365/185.23 |
| 10,297,299 | B2 * | 5/2019 | Lee | G11C 8/10 |
| 10,340,005 | B2 * | 7/2019 | Bertin | G11C 29/02 |
| 10,388,382 | B2 * | 8/2019 | Guo | G11C 16/10 |

(Continued)

OTHER PUBLICATIONS

Eustis, S., "ROMHD and ROMLD" IEEE Circuits and Devices Magazine, 20(5):12-17 (2004).

*Primary Examiner* — Viet Q Nguyen

(57) ABSTRACT

A semiconductor device includes circuitry configured for faster bitcell operation. That circuitry includes a plurality of bitcells readable as one of a '0' value and a '1' value, and voltage generation circuitry configured to apply an activation voltage to activate selected bitcells in the plurality of bitcells for reading. The voltage generation circuitry is further configured to switch between an overdrive mode and a steady-state mode where the voltage generation circuitry applies a first voltage during the overdrive mode and the voltage generation circuitry applies a second voltage, less than the first voltage, during the steady-state mode, interconnect circuitry configured to couple the plurality of bitcells to reading circuitry. The reading circuitry is configured to receive a differential signal from a bitcell and amplify the differential signal to a full digital logic level. The full digital logic level corresponds to one of the '0' value and the '1' value.

21 Claims, 12 Drawing Sheets

(56) References Cited

U.S. PATENT DOCUMENTS

| | | | |
|---|---|---|---|
| 10,672,473 B2* | 6/2020 | Nakazato | G11C 13/0069 |
| 11,276,472 B2* | 3/2022 | Kwak | G11C 16/3427 |
| 2005/0281094 A1* | 12/2005 | Seo | G11C 11/4074 |
| | | | 365/189.09 |
| 2018/0197587 A1* | 7/2018 | Lee | G11C 8/10 |
| 2020/0194086 A1* | 6/2020 | Kwak | G11C 11/5671 |
| 2022/0068399 A1* | 3/2022 | Cho | G11C 16/24 |
| 2022/0084586 A1* | 3/2022 | Nakagawa | G11C 16/08 |

* cited by examiner

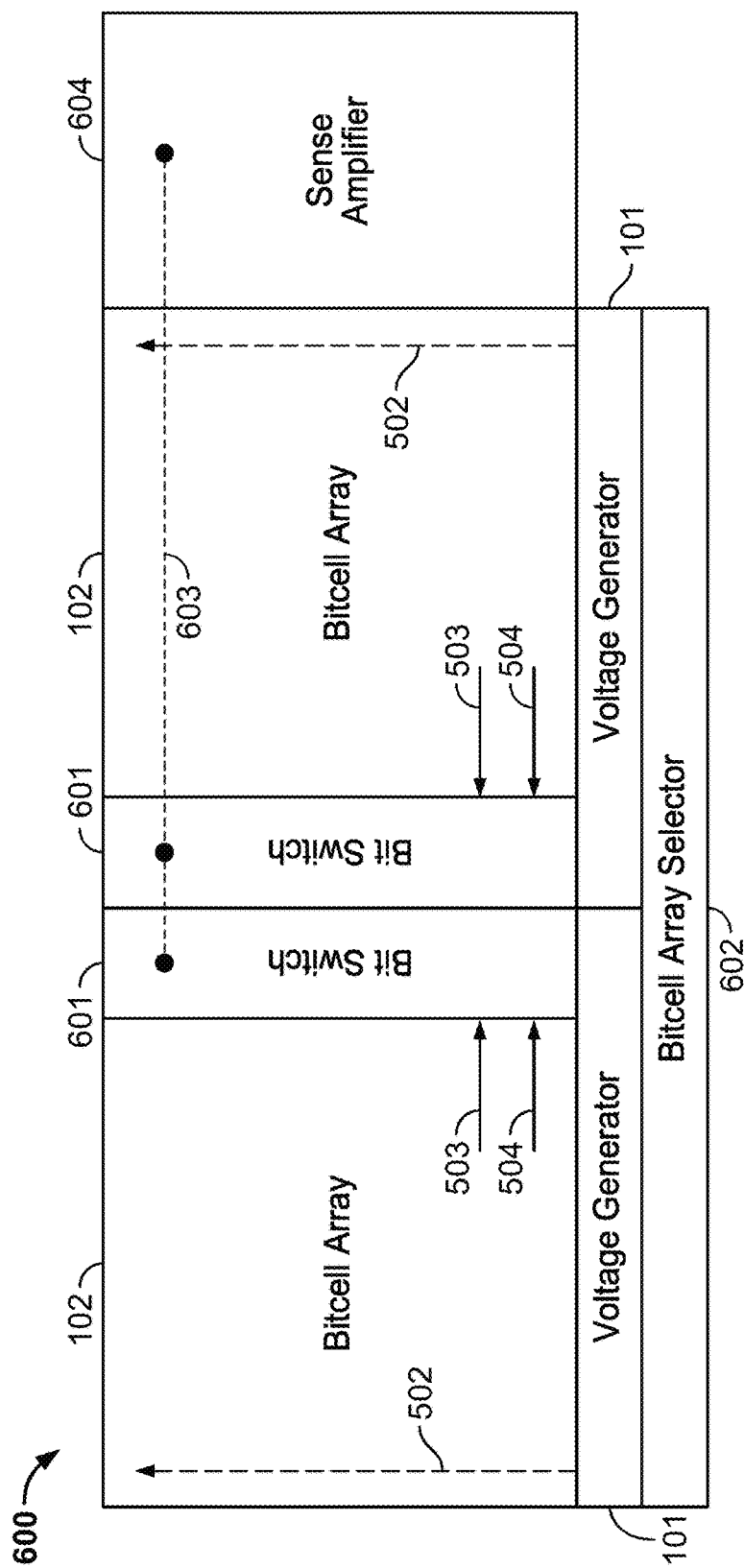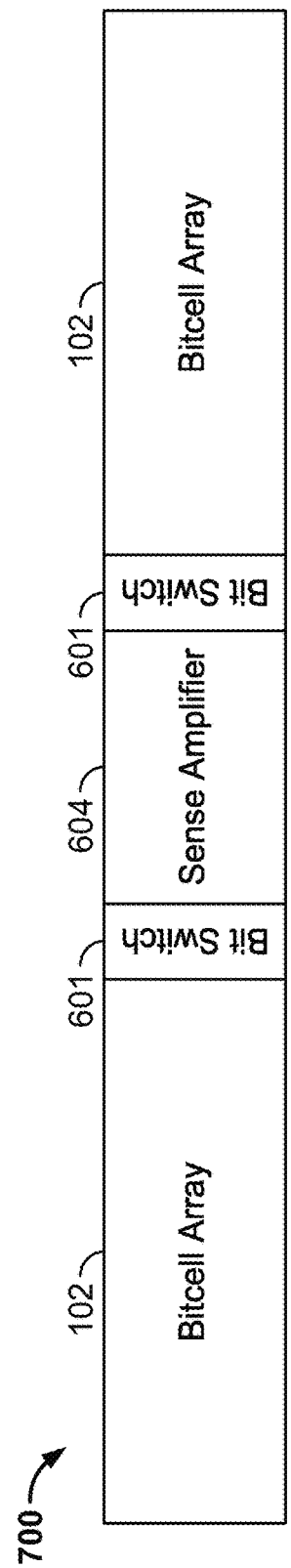
FIG. 6
FIG. 7

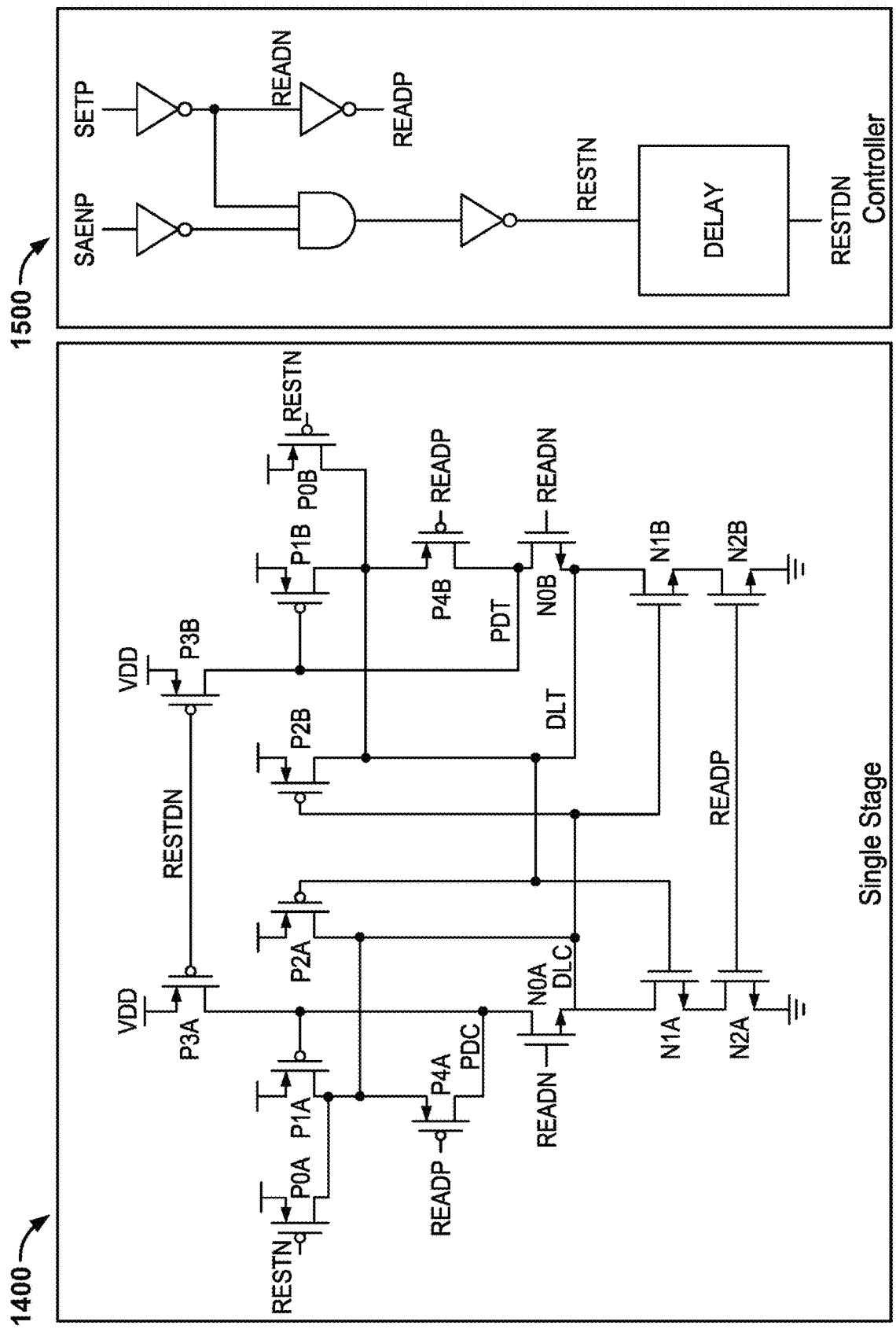

METHOD AND APPARATUS FOR FASTER BITCELL OPERATION

CROSS REFERENCE TO RELATED APPLICATION

This disclosure claims the benefit of commonly-assigned U.S. Provisional Patent Application No. 63/327,786, filed Apr. 5, 2022, which is hereby incorporated by reference herein in its entirety.

FIELD OF USE

This disclosure relates to a method and apparatus for faster bitcell operation. More particularly, this disclosure relates to an arrangement of semiconductor devices for faster and more secure operation of bitcells in digital memory applications.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Many semiconductor devices include bitcells for device memory. A bitcell may refer to a physical semiconductor component for implementing a bit. The operation of such bitcells should include reading and/or writing of either binary digit value, and should be stable (i.e., should be predictable for any one device notwithstanding changes in process conditions, voltage, temperature, age, etc.).

SUMMARY

In accordance with implementations of the subject matter of this disclosure, a semiconductor device includes circuitry configured for faster bitcell operation. That circuitry includes a plurality of bitcells, each bitcell being readable as one of a '0' value and a '1' value, and voltage generation circuitry configured to apply an activation voltage to activate selected bitcells in the plurality of bitcells for reading, the voltage generation circuitry being further configured to switch between an overdrive mode and a steady-state mode wherein the voltage generation circuitry applies a first voltage during the overdrive mode and the voltage generation circuitry applies a second voltage, less than the first voltage, during the steady-state mode, interconnect circuitry configured to couple the plurality of bitcells to reading circuitry, and reading circuitry configured to receive a differential signal from a bitcell and amplify the differential signal to a full digital logic level. The full digital logic level corresponds to one of the '0' value and the '1' value.

In a first implementation of such a semiconductor device, each bitcell in the plurality of bitcells may include a differential transistor pair including intentionally mismatched transistors, where a first transistor has a first threshold voltage and a second transistor has a second threshold voltage, less than the first threshold voltage.

According to a first aspect of that first implementation, the threshold voltage of the first transistor may exceed the threshold voltage of the second transistor by a differential threshold voltage magnitude, the differential threshold voltage magnitude may be larger than a threshold voltage variation, due to process, voltage, or temperature variation, or device aging, of the first transistor and a threshold voltage variation, due to process, voltage, or temperature variation, or device aging, of the second transistor, and the bitcell may be configured to output a differential signal, the differential signal having a differential signal magnitude proportional to the differential threshold voltage magnitude.

In a first instance of that first aspect, the differential threshold voltage magnitude may be at least twice the magnitude of an outlier threshold voltage variation, and the outlier threshold voltage variation may be equal to four times a standard deviation of a threshold voltage variation, due to process, voltage or temperature variation, or device aging.

According to a second aspect of that first implementation, each bitcell may output a first current profile when readable as the '0' value and a second current profile when readable as the '1' value, the first current profile being identical to the second current profile.

According to a third aspect of that first implementation, a layout of the first transistor may be visually identical to a layout of the second transistor.

In a second implementation of such a semiconductor device, the voltage generation circuitry may include at least one transistor configurable to provide the first voltage during the overdrive mode.

In a third implementation of such a semiconductor device, the voltage generation circuitry may include at least one transistor, the transistor may be configurable to divide a full power supply voltage to a selectable fraction of the full power supply voltage, and the transistor may provide the selectable fraction of the full power supply voltage as the second voltage during the steady-state mode.

In a fourth implementation of such a semiconductor device, the interconnect circuitry may include a plurality of bit switch circuits, each bit switch circuit in the plurality of bit switch circuits being configured to couple a respective bitcell signal from a higher-loss path to a lower-loss path.

In a fifth implementation of such a semiconductor device, the interconnect circuitry may include a plurality of bit switches, each bit switch being coupled to an array of bitcells, and each respective bit switch being located in a respective geometric position that minimizes average distance between the respective bit switch and bitcells coupled to the respective bit switch.

In a sixth implementation of such a semiconductor device, the reading circuitry may be a differential current sense amplifier, the sense amplifier circuitry may include a two-stage circuit, transistors of a first stage of the two-stage circuit may create a differential voltage on a pair of data lines, transistors of the first stage may further couple to a second stage of the two-stage circuit by outputting a low voltage signal, transistors of the second stage of the two-stage circuit may drive the sense amplifier to the full digital logic level, and transistors of the second stage of the two-stage circuit may further couple the sense amplifier to additional circuitry.

In a seventh implementation of such a semiconductor device, the reading circuitry may include a single-stage differential current sense amplifier, transistors of the single stage may be configured to implement at least one pass gate, transistors of the single stage may further be configured to implement at least one mirror diode, pass gates of the at least one pass gate being configurable to control the at least one mirror diode, and mirror diodes of the at least one mirror diode creating a differential voltage on a pair of data lines, transistors of the single stage may further be configured to convert the differential voltage to the full digital logic level, and transistors of the single stage may further be configured to couple the sense amplifier to additional circuitry.

In accordance with implementations of the subject matter of this disclosure, a method for rapid operation of a bitcell array, where the bitcell array includes a plurality of bitcells, each bitcell including a differential pair of transistors and being readable as one of a '0' value and a '1' value, includes activating bitcells in the plurality of bitcells using voltage generation circuitry where a first voltage is applied during an overdrive mode and a second voltage less than the first voltage is applied during a steady-state mode, coupling the bitcells to reading circuitry using interconnect circuitry, receiving the differential signal using the reading circuitry, and amplifying the differential signal to a full digital logic level using the reading circuitry.

A first implementation of such a method may further include applying a single activation voltage to a first transistor and a second transistor of the differential pair of transistors of a bitcell, where the single activation voltage induces a first signal in the first transistor and a second signal in the second transistor, and the first signal is stronger than the second signal by a magnitude.

A first aspect of that first implementation may further include amplifying the differential signal during a processing time, the processing time being inversely proportional to a magnitude by which the first signal is stronger than the second signal.

A second aspect of that first implementation may further include activating a bitcell that is readable as the '0' value to provide a first current profile, and activating a bitcell that is readable as the '1' value to provide a second current profile, the second current profile being identical to the first current profile.

A second implementation of such a method may further include providing the first voltage during the overdrive mode using at least one transistor within the voltage generation circuitry.

A third implementation of such a method may further include dividing a full power supply voltage to a selectable fraction of the full power supply voltage using at least one transistor within the voltage generation circuitry, providing the selectable fraction of the full power supply voltage as the second voltage during the steady-state mode.

A fourth implementation of such a method may further include routing a respective bitcell signal from a higher-loss path to a lower-loss path using the interconnect circuitry.

A fifth implementation of such a method may further include reading the bitcell signal using a two-stage differential current sense amplifier, and operating the sense amplifier in each of three phases at different times, the phases including a pre-charge phase, pre-amplification phase, and decision phase, where the pre-charge phase may charge nodes of the first and second stage up to the full digital logic level, the pre-amplification phase may apply a differential voltage between a pair of data lines, the decision phase may amplify the differential voltage by pulling one data line in the pair of data lines to a zero voltage state using the first stage, the decision phase may further couple a signal from the first stage to the second stage, the decision phase may further convert the differential voltage to the full digital logic level, using the second stage, and the decision phase may further couple the reading circuitry to additional circuitry using the second stage.

A sixth implementation of such a method may further include reading the bitcell signal using a single-stage differential current sense amplifier, and operating the sense amplifier in each of four phases at different times, the phases including a pre-charge phase, pre-amplification phase, sensing phase, and delivery phase, where the pre-charge phase may charge up a pair of data lines up to the full digital logic level, the pre-amplification phase may activate one or more pass gates to enable one or more current mirrors, the pre-amplification phase may discharge the pair of data lines to below the full digital logic level, the pre-amplification phase may further apply a differential voltage to one data line of the pair of data lines discharged to below the full digital logic level, the sensing phase may convert the differential voltage to the full digital logic level, and the delivery phase may couple the reading circuitry to additional circuitry.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 6 is a second representative system including elements of the subject matter of this disclosure;

FIG. 7 is a third representative system including elements of the subject matter of this disclosure;

FIG. 14 is a representation of a single-stage sense amplifier circuit;

FIG. 15 is a schematic representation of a controller of the single-stage sense amplifier circuit.

DETAILED DESCRIPTION

Figure 1:
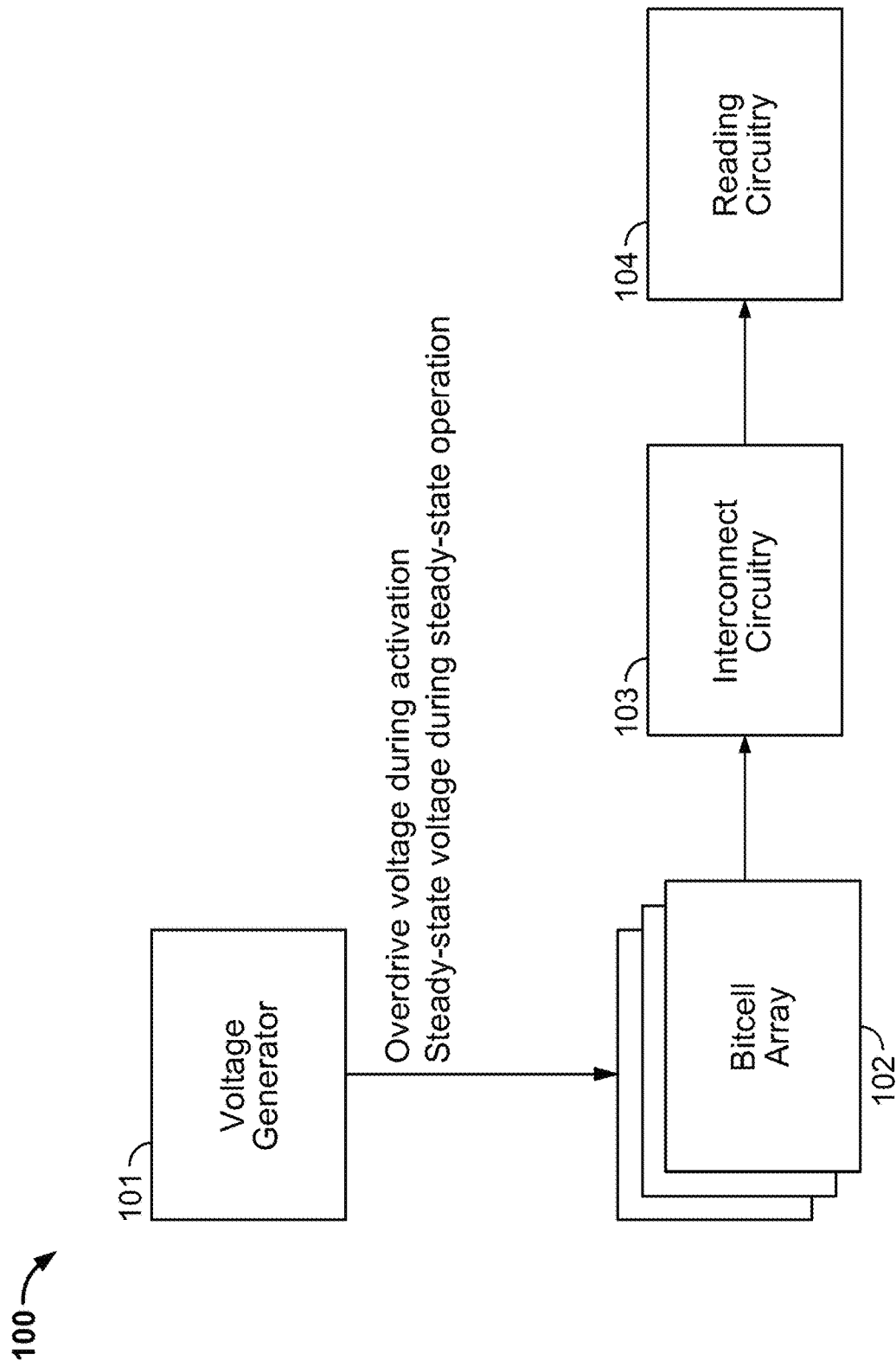
FIG. 1 is a block diagram of an overall architecture in accordance with implementation of the subject matter of this disclosure of a method and apparatus for faster bitcell operation.

A fundamental unit of digital memory operation is a bit. In a semiconductor device, physical implementation of the bit may be realized by a bitcell.

Compared to current industry standards, the speed of memory operations executed by semiconductor devices could be faster, i.e., there could be a shorter delay between sending, executing, and returning commands to read or write bit values. In practice, memory operations may be delayed by factors including, but not limited to, a switching speed of the bitcell, a response time of circuitry activating the bitcell, a response time of circuitry reading or writing to the bitcell, and a response time of circuitry coupling the activating circuitry and/or reading or writing circuitry to the bitcell.

Reduction in feature sizes of semiconductor devices may introduce additional challenges in progressing toward faster memory operations. These challenges arise from physical effects including, but not limited to, transistor channel length modulation, transistor drain-induced barrier lowering, transistor leakage current, parasitic resistance and capacitance of transistor elements, and parasitic resistance and capacitance of interconnect pathways.

A bitcell may include a pair of transistors. The pair of transistors may be a differential pair, for which a single action, such as an activation process, induces two respective signals in the two respective transistors. The difference between these respective signals may be considered a single differential signal. A differential signal may be very small. To determine the value of such a differential signal output by a bitcell, sense amplifier circuitry may be used to amplify the relatively small differential signal to a larger signal, which may be read more quickly (because it is more easily recognized as either a '0' or a '1'). In addition, if the differential signal can be amplified more rapidly, that also can increase the reading speed. These two approaches may be used separately or together to increase the speed of memory operations.

A fundamental class of digital memory is read-only memory (ROM). ROM contains stable data that may be written onto the semiconductor device during fabrication or, in some cases, after fabrication using special techniques. Computer applications may read, but normally may not overwrite, ROM bits.

When implementing generalized or application-specific computer architectures, ROM systems may include "personalized" bitcell arrays. These personalized arrays may be expressly designed for enabling operations of the system in which they are incorporated. As such, it may be desirable to protect the data in the personalized arrays to maintain data security or device operation security, and to protect intellectual property.

Therefore, ROM should ideally be secure—i.e., there should be no mechanism by which unauthorized users can determine the data stored in a ROM bitcell. However, in practice, ROM bitcells that encode a '0' value may be distinguishable from ROM bitcells that encode a '1' value through "reverse engineering"—e.g., by visually inspecting the physical layout of the bitcell and/or by probing output currents transmitted from the bitcell. In these instances, the ROM and the personalized data stored in the ROM may be susceptible to replication and theft, while the systems incorporating the ROM may be susceptible to infiltration.

In accordance with implementations of the subject matter of this disclosure, the foregoing concerns regarding bitcell speed and security may be addressed by circuitry that allows faster and more secure bitcell fabrication and operation.

The subject matter of this disclosure may be better understood by reference to FIGS. 1-16.

Implementation 100 of an overall architecture in accordance with implementation of the subject matter of this disclosure is shown in FIG. 1.

Architecture 100 includes voltage generation circuitry 101. The voltage generation circuitry activates a bitcell array 102. The voltage generation circuitry activates a bitcell array in each of two operating modes, an overdrive mode and a steady-state mode, as described above and in more detail below. Activated bitcells of the bitcell array are coupled to interconnect circuitry 103 and further coupled to reading circuitry 104. The interconnect circuitry may include bit switches. The reading circuitry may include a two-stage or single-stage differential current sense amplifier. Each of these elements, individually and when integrated into a system, contribute to faster bitcell operation.

Figure 2:
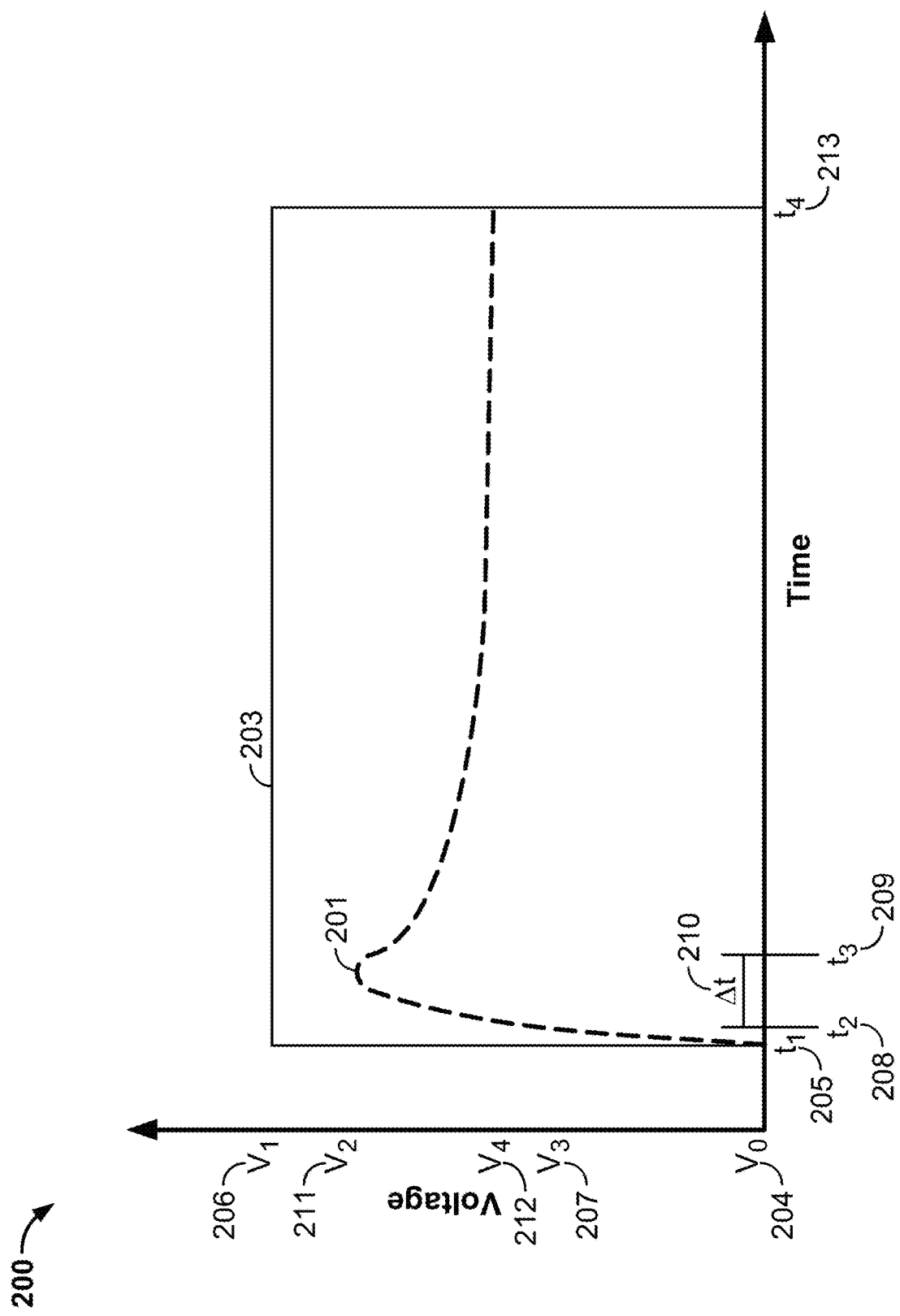
FIG. 2 is a graphical representation of an activation voltage signal applied to a bitcell in accordance with implementations of the subject matter of this disclosure.

Voltage generation circuitry 101 may generate a bitcell activation signal as shown in FIG. 2. A time-dependent activation voltage signal 201, which includes operation in each of the overdrive mode and the steady-state mode, is sent from the voltage generation circuitry. The voltage generation circuitry is triggered by a digital signal 203—e.g., a clock cycle. Prior to being triggered, the circuit node activated by the voltage generation circuitry resides at voltage $V_0$ 204—e.g., a zero-voltage condition or a logical '0' condition. At time $t_1$ 205, the digital signal 203 triggers the voltage activation circuit by rising to $V_1$ 206—e.g., a supply-voltage condition or a logical '1' condition. The voltage generation circuitry 101 proceeds to apply an overdrive voltage, which charges the activated circuit node to a greater voltage. The activated circuit node reaches an intermediate voltage $V_3$ 207 at time $t_2$ 208, whereupon a differential signal from a bitcell may be sufficiently large for reading a bit value using the reading circuitry 104. In the absence of the overdrive voltage mode, the voltage generation circuitry charges the same activated circuit node to the same intermediate voltage 207 at some later time—e.g., $t_3$ 209. A time difference $\Delta t$ 210 between $t_2$ and $t_3$ represents a time interval by which the speed of bitcell activation has increased due to operation under the overdrive voltage mode. Operating in the overdrive mode, the voltage generation circuitry proceeds to charge the activated circuit node to a peak voltage $V_2$ 211, a condition which generally coincides with the transition of the voltage generation circuitry from operating in the overdrive mode to operating in the steady-state mode. The magnitude of the peak voltage 211 may correlate with the magnitude of the time difference 210. During operation in the steady-state mode, the activated and overdriven circuit node discharges to a steady-state voltage $V_4$ 212. The steady-state voltage 212 may be a configurable fraction of the full power-supply voltage—e.g., half of the full power supply voltage. Operating in the steady-state mode, the voltage generation circuitry settles the activated circuit node to the steady-state voltage prior to the end of a respective activation cycle at time $t_4$ 213.

Figure 3:
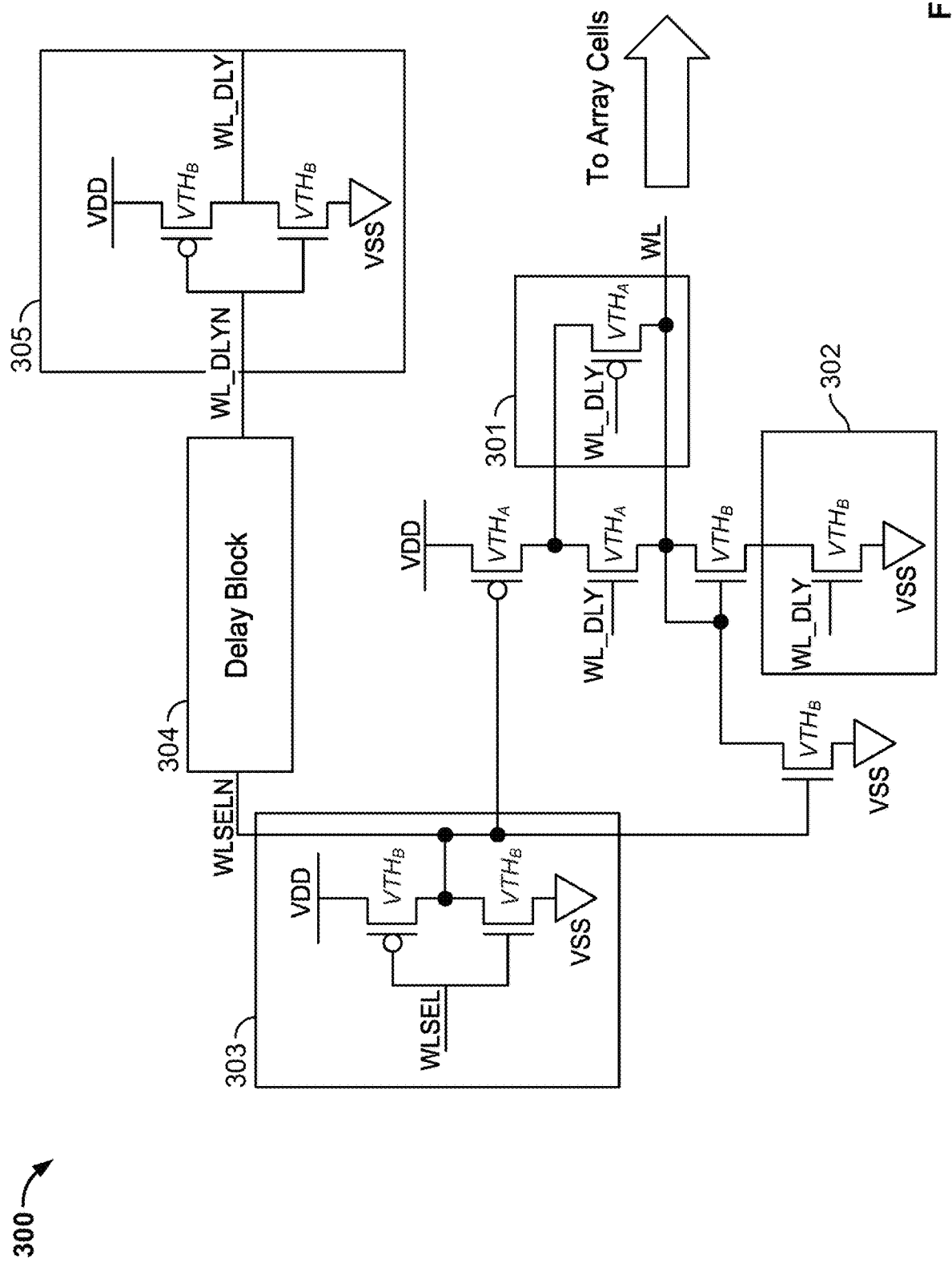
FIG. 3 is a schematic representation of a first implementation of voltage generation circuitry in accordance with the subject matter of this disclosure for applying an activation voltage signal.

A representative first implementation 300 of voltage generation circuitry 101 in accordance with the architecture 100 and designed for realizing bitcell activation signal 201 is shown in FIG. 3, where $VTH_A < VTH_B$. A first transistor 301 (e.g., a PFET) charges the activated circuit node (e.g., "WL") to peak voltage 211 during the overdrive mode of operation. The configuration of transistor 301, including its size and its node couplings, determines the magnitude of the peak voltage 211 and time difference 210. A second transistor 302 (e.g., an NFET) discharges the activated circuit node to steady-state voltage 212 during the steady-state mode of operation. The configuration of transistor 302, including its size and node couplings, may determine the magnitude of the steady-state voltage 212. A first logic gate 303 may enable the dual mode operation of the voltage generation circuitry 300. When an input signal (e.g., 203 or "WLSEL") to the first logic gate switches from the digital '0' value to the digital '1' value, transistor 301 connects to a high voltage node (e.g., a power-supply voltage) and charges the activated circuit node to the peak voltage. Via the delay block 304, the input signal to the first logic gate propagates to a second logic gate 305. After this input signal is processed by the second logic gate, the transistor 301 is turned off and the transistor 302 is turned on. Thereupon, the voltage generation circuitry transitions from operating in the overdrive mode to operating in the steady-state mode. The delay introduced by the delay block 304 may determine the relative amount of time spent in each of the overdrive and steady-state modes of operation.

Figure 4:
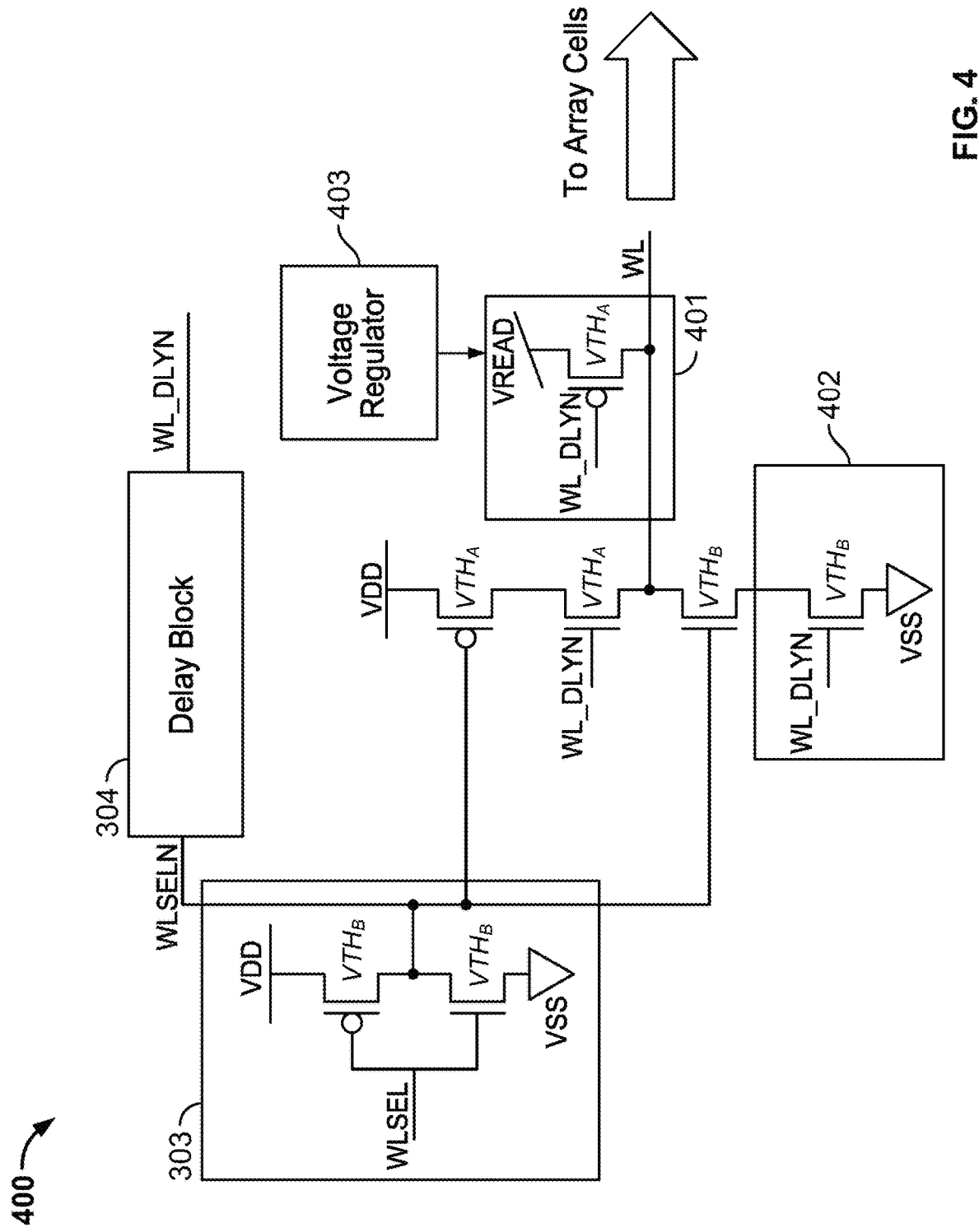
FIG. 4 is a schematic representation of a second implementation of voltage generation circuitry in accordance with the subject matter of this disclosure for applying an activation voltage signal.

A representative second implementation 400 for implementing voltage generation circuitry 101 in accordance with architecture 100 and designed for realizing bitcell activation signal 201 is shown in FIG. 4, where $VTH_A<VTH_B$. A transistor 401 (e.g., a PFET) charges the activated circuit node (e.g., "WL") to peak voltage 211 during the overdrive mode of operation. The configuration of the transistor 401, including its size and its node couplings, determines the magnitude of the peak voltage 211 and time difference 210. Transistor 401 may be the same as transistor 301. A transistor 402 (e.g., an NFET) discharges the activated circuit node to steady-state voltage 212 during the steady-state mode of operation. Transistor 402 may be the same as transistor 302. The activation and input signal propagation through voltage generation circuit 400 may be similar to voltage generation circuit 300. In one element distinguishing implementation 400 from implementation 300, transistor 401 couples to a voltage regulator 403. Coupling to the voltage regulator results in system 400 applying an activation voltage 201 with a configurable peak voltage 211.

Figure 5:
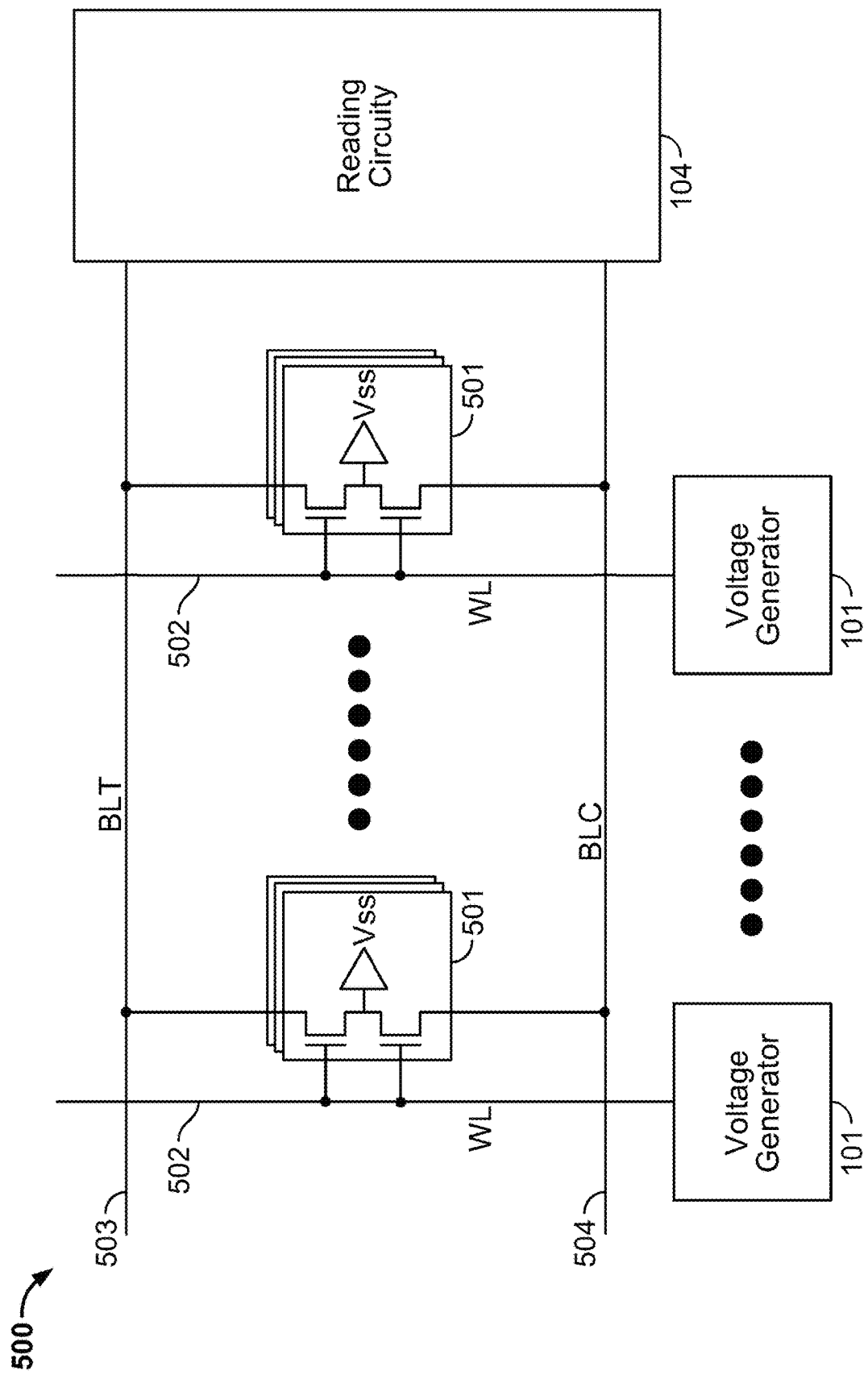
FIG. 5 is a first representative system including elements of the subject matter of this disclosure.

A first representative system 500 incorporating elements of the subject matter of this disclosure, including integrated elements of architecture 100, is shown in FIG. 5. The system includes the voltage generator circuitry 101 and reading circuitry 104. The system further includes a set of bitcells 501, representing a subset of the bitcell array 102. Each respective voltage generator 101 activates a respective bitcell set 501 through a respective "WL" ("word line") node 502, which may be equivalent to a node coupled to transistor 301 or transistor 401. Each bitcell of the bitcell set 501 is made from a transistor pair. Both gate terminals of the transistor pair couple to a WL node 502. Thereby, a voltage generator 101 simultaneously activates the transistors of the transistor pair. At one node of each bitcell in the set of bitcells 501, a first transistor in the transistor pair couples to a "BLT" ("bitline true") data line 503. At another node of each bitcell in the set of bitcells 501, a second transistor in the transistor pair couples to a "BLC" ("bitline complement") data line 504. The data lines BLT 503 and BLC 504 couple to reading circuitry 104. Although certain elements of FIG. 5 share a designation (e.g., 101, 501, 502), these elements are separate (i.e., electrically isolated) from each other. These elements are repeated to depict a system including a plurality of said elements, and to depict various additional elements (e.g., 104, 503, 504) that may be more globally shared by (i.e., coupled to) those elements.

In addition to supporting faster bitcell operation, the architecture of FIG. 5 supports secure bitcell operation. Because neither BLT 503 nor BLC 504 is connected to ground, signals sent from the bitcell array 501 and received by the reading circuitry 104 do not pull a voltage of either 503 or 504 to ground (e.g., '0'). As a result, when implemented as read-only memory cells, binary values of the bitcell set 501 could not be deduced from current output inspection probing for the ground signal. Therefore, the bitcells are secured against current-profile-based decoding.

A second representative system 600 incorporating elements of the subject matter of this disclosure, including integrated elements of architecture 100, is shown in FIG. 6. In FIG. 6, elements of FIG. 5 are displayed to represent a geometric layout of an integrated circuit including those elements and additional elements. Bit switch circuitry 601 is positioned contiguous to bitcell array 102. This positioning may minimize an average distance between the geometric position of the bit switch 601 and the geometric position of each bitcell in the bitcell array 102. Rather than directly coupling BLT 503 and BLC 504 to reading circuitry 104 (as in FIG. 5), the bit switch 601 receives the signals 503 and 504. Upon receiving those signals, the bit switch circuitry routes those signals from a higher-loss path to a lower-loss path. The signal routing from a higher-loss path to a lower-loss path improves the speed of bitcell operation, because losses that reduce the magnitude of the differential bitcell signal are minimized. A bitcell array selector 602 controls a bit switch 601 to enable a plurality of wordlines 502 to couple to each bit switch (e.g., 4 wordlines to 1 bit switch). The bit switch 601 routes differential bitcell signals through path 603 to sense amplifier 604. The sense amplifier may be equivalent to reading circuitry 104, or it may be a subcomponent thereof. Although certain elements of FIG. 6 share a designation (e.g., 101, 102, 502, 503, 504, 601), these elements are separate (i.e., electrically isolated) from each other. These elements are repeated to depict a system having a plurality of such elements, and to depict various additional elements (e.g., 602, 603, 604) that may be more globally shared by (i.e., coupled to) those elements.

A third representative system 700 incorporating elements of the subject matter of this disclosure, including integrated elements of architecture 100, is shown in FIG. 7. The elements of FIG. 6 that are not depicted in FIG. 7 may nonetheless be retained in FIG. 7 within their respective subsystems. In FIG. 7, a bit switch 601 is positioned contiguous to both a bitcell array 102 and a sense amplifier 604. Compared to the geometric layout of FIG. 6, this representation embodies an alternate design toward minimizing an average distance between the geometric position of the bit switch 601 and the geometric position of each bitcell included in the bitcell array 102.

Figure 8:
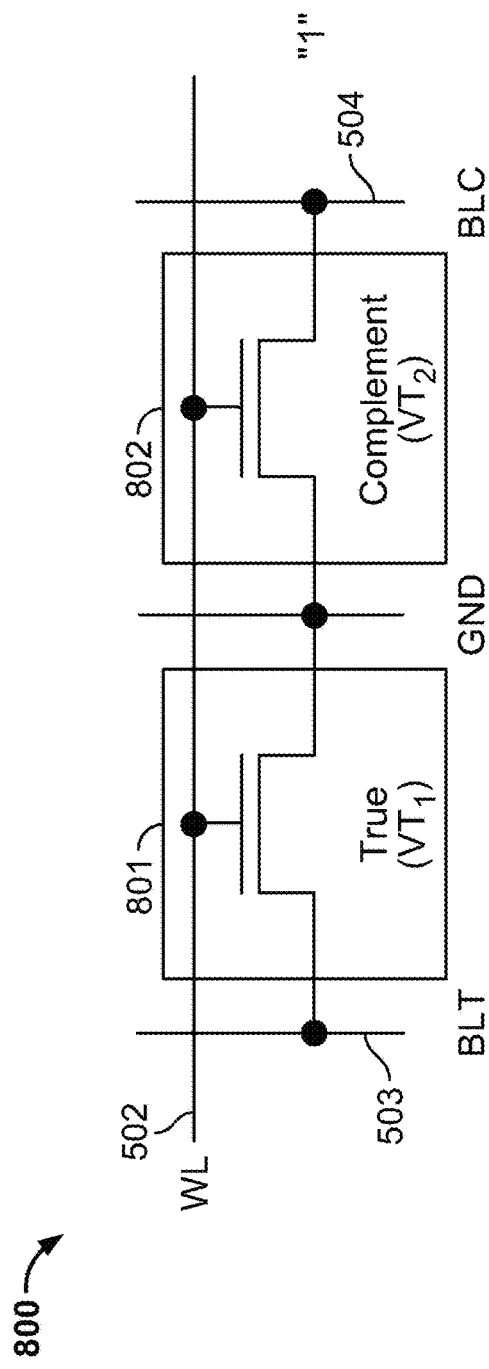
FIG. 8 is a schematic representation of a bitcell encoding a '1' bit value.

A representative schematic 800 of a single bitcell—e.g., a unit within bitcell array 102 or bitcell set 501—encoding the '1' bit value is shown in FIG. 8. The bitcell includes a differential transistor pair. The differential transistor pair includes a first true device 801 with a first threshold voltage $VT_1$ and a node coupling to BLT 503, and a second complement device 802 with a second threshold voltage $VT_2$, less than the first threshold voltage, and a node coupling to BLC 504. The bitcell encodes the '1' bit value due to the true device 801 having the first threshold voltage $VT_1$. The threshold voltage difference (e.g., between $VT_1$ and $VT_2$) gives rise to the differential bitcell signal despite the transistor pair being activated by the same WL node 502 (e.g., equivalent gate-source voltages).

Figure 9:
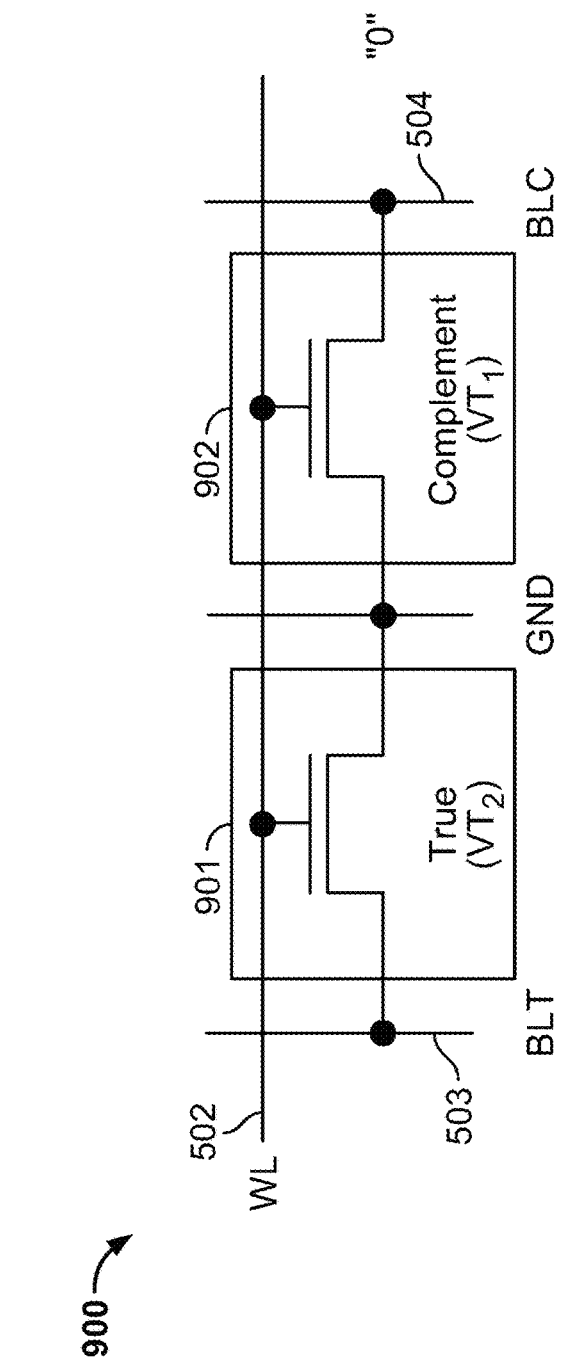
FIG. 9 is a schematic representation of a bitcell encoding a '0' bit value.

A representative schematic 900 of a single bitcell—e.g., a unit within bitcell array 102 or bitcell set 501—encoding the '0' bit value is shown in FIG. 9. The bitcell includes a differential transistor pair. The differential transistor pair includes a first true device 901 with the second threshold voltage $VT_2$ and a node coupling to BLT 503, and a second complement device 902 with the first threshold voltage $VT_2$, greater than the first threshold voltage, and node coupling to BLC 504. The bitcell encodes the '0' bit value due to the true device 901 having the second threshold voltage $VT_2$.

In accordance with implementations of the subject matter of this disclosure, the elements of FIGS. 8-9 contribute to the faster and secure bitcell operation described herein. These contributions may be better understood by reference to FIGS. 10-11.

Figure 10:
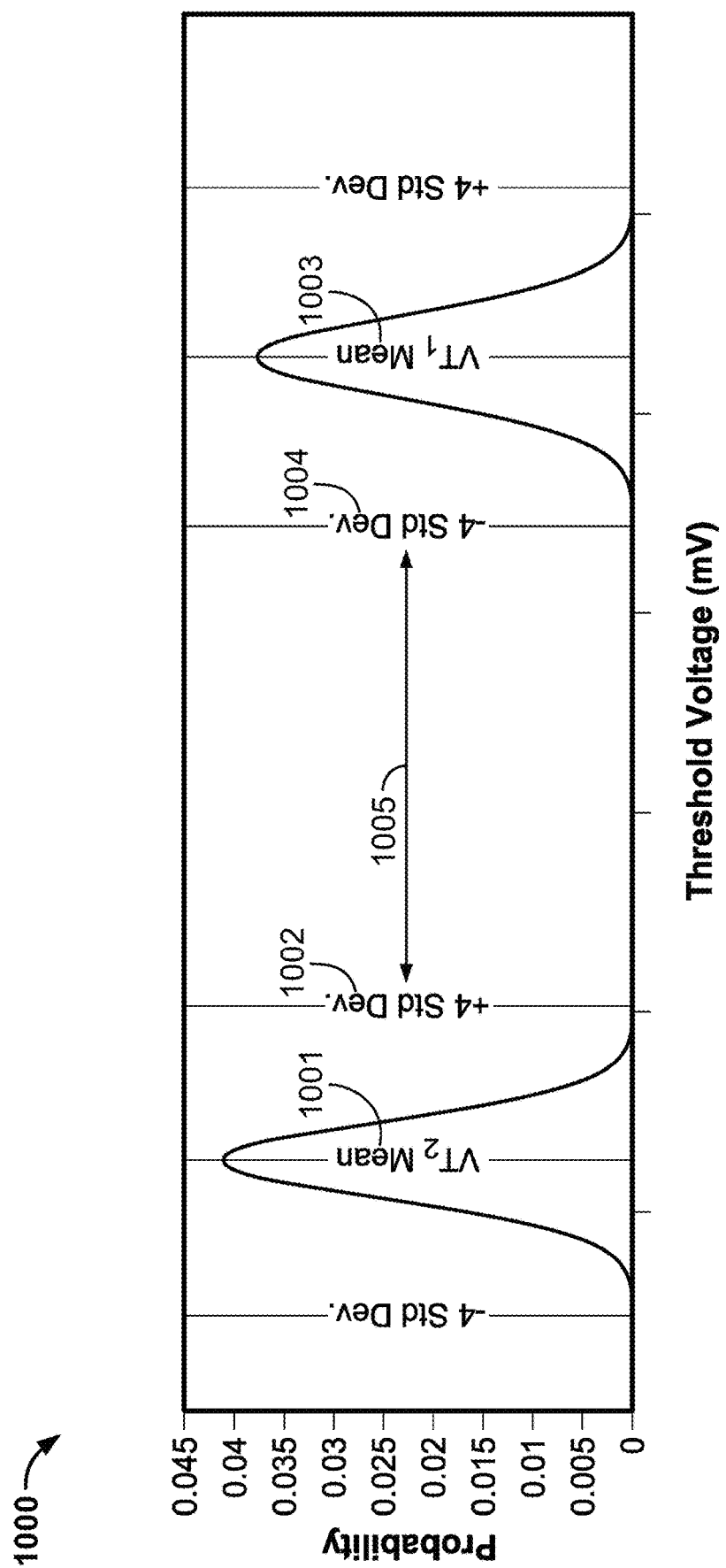
FIG. 10 is a graphical representation of a transistor pair with intentionally mismatched threshold voltages.

A graphical representation 1000 of threshold voltages of a transistor pair with intentionally mismatched threshold voltages—e.g., as in FIG. 8 or FIG. 9—is shown in FIG. 10. The intentionally mismatched transistor pair supports faster bitcell operation, as further explained below. The intentionally mismatched threshold voltages include a first threshold voltage $VT_1$ 1003. The first threshold voltage is a mean value of a first threshold voltage variation, the variation due to process, voltage, or temperature variation, or device aging. Considering the first threshold voltage variation, in approximately 99.99% of operational instances, the first threshold voltage resides above a ($VT_1$–4 Std Dev.) value 1004, where "Std Dev." refers to a standard deviation of the first threshold voltage variation. The intentionally mismatched threshold voltages further include a second threshold voltage $VT_2$ 1001. The second threshold voltage is a mean value of a second threshold voltage variation, the variation due to process, voltage, or temperature variation, or device aging. Considering the second threshold voltage variation, in approximately 99.99% of operational instances, the second threshold voltage resides below a ($VT_2$+4 Std Dev.) value 1002, where "Std Dev." refers to a standard deviation of the second threshold voltage variation. A minimum threshold voltage variation difference 1005 therefore exists between the respective transistors of the transistor pair. Under activation by equivalent signals from the voltage generation circuitry—e.g., from WL node 502 as shown in FIG. 8 or FIG. 9—a bitcell produces a differential signal proportional to the magnitude of the threshold voltage variation difference 1005. Therefore, in conjunction with activation by the voltage generator 101 and reading by the reading circuitry 104, each bitcell of the bitcell array 102 contributes to faster bitcell operation through the intentional mismatching of the transistors within the transistor pair that forms the bitcell. This intentional mismatching includes fabricating the respective transistors with different threshold voltages—e.g., $VT_1$ 1003 and $VT_2$ 1001—and maximizing the difference between the threshold voltages 1005.

Figure 11:
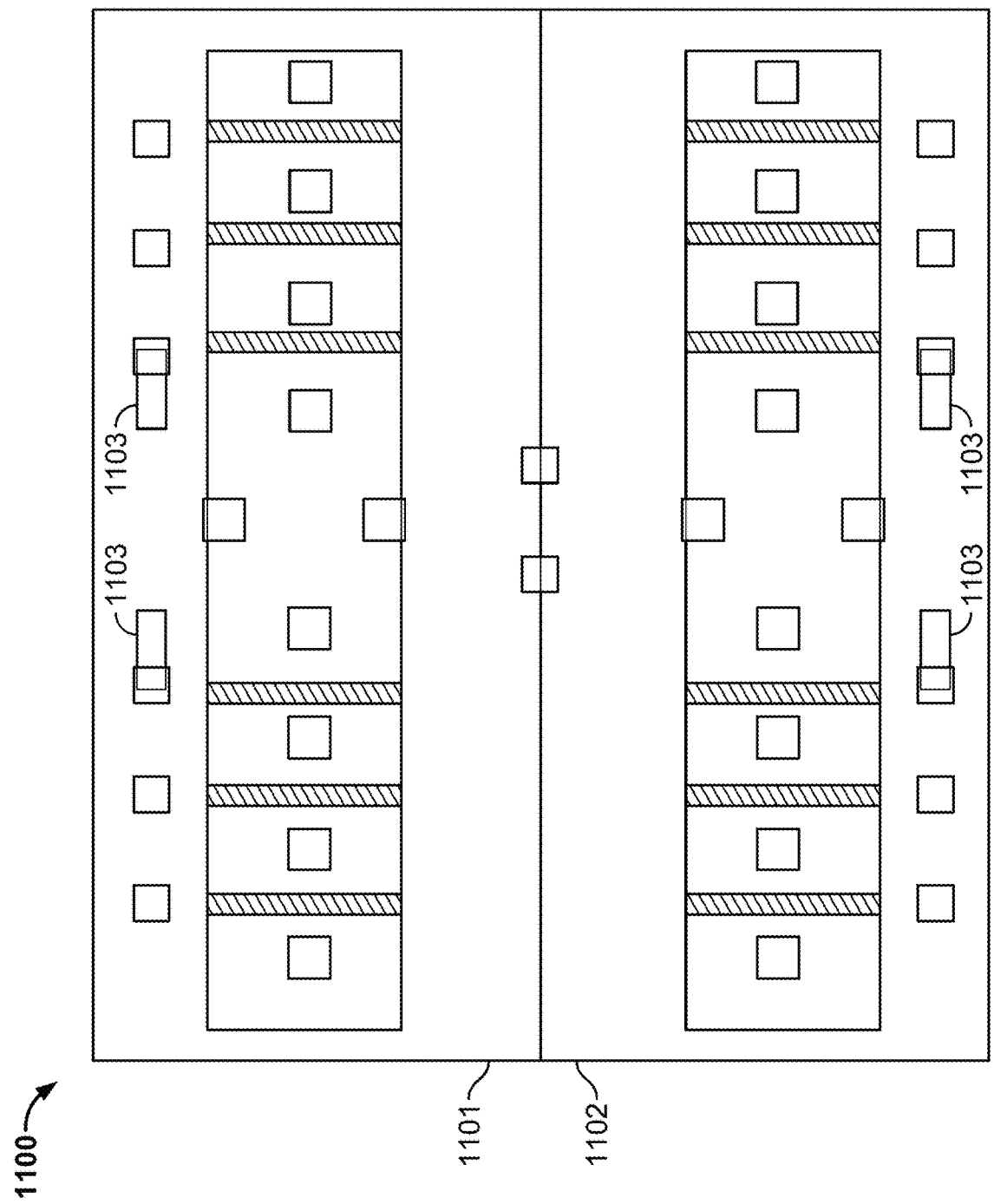
FIG. 11 is a geometric device layout representation of a bitcell including a transistor pair.

A device layout representation 1100 of a bitcell incorporating a transistor pair—as in FIG. 8 or FIG. 9—is shown in FIG. 11. The intentionally mismatched transistor pair supports secure bitcell operation, as further explained below. The layout includes a first transistor 1101 and a second transistor 1102, where either transistor may correspond to either of the true or complement device and either of the first or second threshold voltage, as shown in FIGS. 8-9. The layout of the first transistor is visually identical to the layout of the second transistor. Due to having visually identical layouts, an encoded bit value (i.e., '0' or '1') of the bitcell 1100 could not be deduced from visual inspection of the bitcell. Therefore, when implemented as read-only memory, bitcell 1100 is secured against visual decoding. In particular, vias 1103 are further highlighted as identical. Therefore, device layout 1100 is secure against visual inspection and "reverse engineering" of bitcell values.

Figure 13:
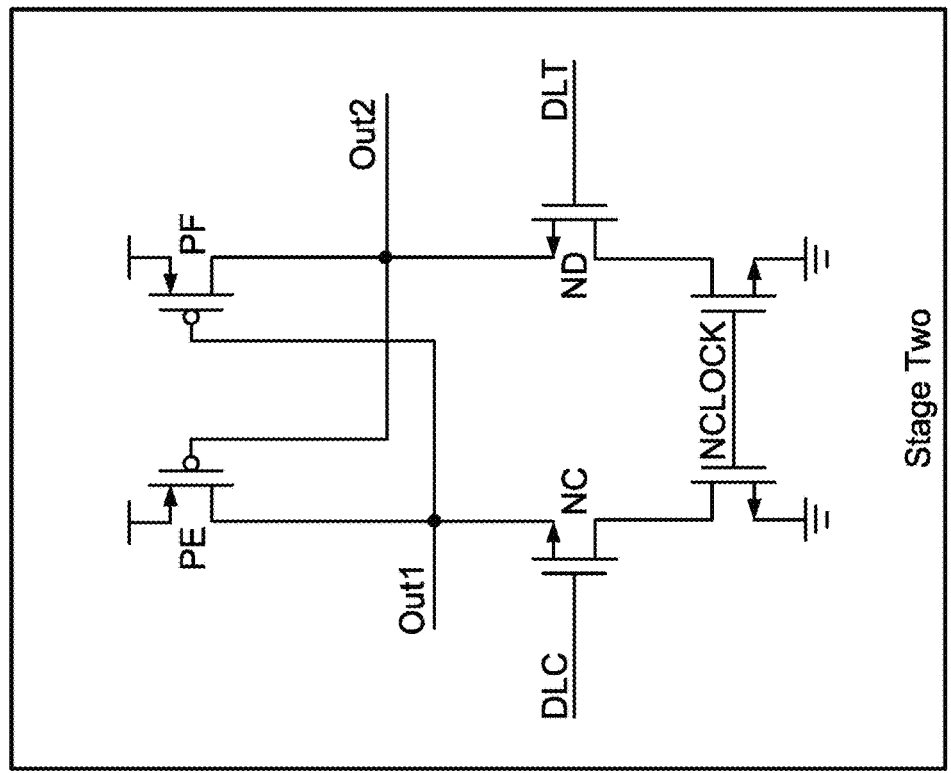
FIG. 13 is a representation of a second stage of the two-stage sense amplifier circuit.
Figure 12:
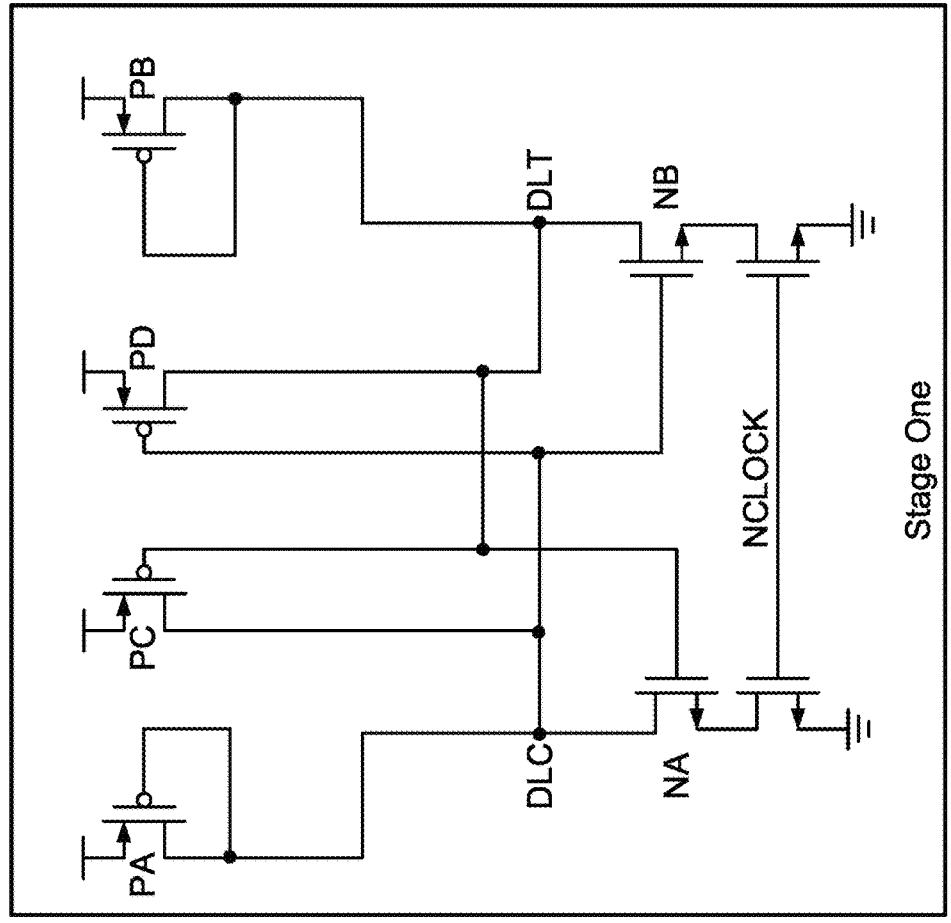
FIG. 12 is a representation of a first stage of a two-stage sense amplifier circuit.

Representative implementations 1200 and 1300 of aspects of the reading circuitry 104 in accordance with the architecture 100 are shown in FIGS. 12 and 13. Reading circuitry 104 may include a two-stage differential current sense amplifier, with a first stage 1200 shown in FIG. 12 and a second stage 1300 shown in FIG. 13. Transistors (e.g., PFETs) of the first stage 1200—i.e., "PA," "PB," "PC," and "PD"—amplify a differential voltage across a pair of data lines, "DLC" and "DLT". Transistors (e.g., NFETs) of the first stage 1200—i.e., "NA" and "NB"—output a low voltage signal for coupling to the second stage 1300. Transistors (e.g., PFETs) of the second stage 1300—i.e., "PE" and "PF"—amplify the differential voltage to the full digital logic level. The second stage 1300 couples this full digital logic level to additional circuitry through data lines "Out1" and "Out2."

The first stage 1200, and the second stage 1300, of a differential current sense amplifier may be operated, in accordance with implementations of the subject matter of this disclosure, in each of three phases at different times, including a pre-charge phase, pre-amplification phase, and decision phase. The pre-charge phase includes charging nodes—i.e., "DLC" and "DLT"—of the first stage 1200 and second stage 1300 to the full digital logic level. The pre-amplification phase includes applying a differential voltage between the pair of data lines, "DLC" and "DLT." The decision phase includes amplifying the differential voltage by pulling one data line to a zero-voltage state, using the first stage. The decision phase further includes coupling the amplified signal from the first stage to the second stage. The decision phase further includes converting the differential voltage to the full digital logic level and coupling one or both of the data lines to additional circuitry, using the second stage.

A second representative pair of implementations 1400 and 1500 for implementing some of the reading circuitry 104 in accordance with the architecture 100 is shown in FIGS. 14 and 15. Reading circuitry 104 may include a single-stage differential current sense amplifier, including a single stage 1400 shown in FIG. 14 and a controller 1500 shown in FIG. 15. Transistors (e.g., PFETs) of the single stage 1400—i.e., "POA" and "POB"—implement pass gates that couple signals to other devices of the stage during relevant operation phases. Additional transistors (e.g., PFETs) of the single stage 1400—i.e., "P1A" and "P1B"—as controlled by the pass gates, create a differential voltage across a pair of data lines, "DLC" and "DLT." Additional transistors (e.g., PFETs) of the single stage 1400—i.e., "P2A" and "P2B"—convert the differential voltage to the full digital logic level. Additional transistors (e.g., NFETs) of the single stage 1400—i.e., "N1A" and "N1B"—along with other transistors (e.g., PFETs) of the single stage operating in a different mode—i.e., "P1A" and "P1B"—couple this full digital logic level to additional circuitry through the pair of data lines "DLC" and "DLT."

Signals of the controller 1500—i.e., "RESTN," "RESTDN," "READP," and "READN"—control the single-stage amplifier 1400. The RESTN and RESTDN signals control pre-charging of the data lines "DLC" and "DLT" to the full digital logic level. The READN signal opens the one or more pass gates and initiates amplification of the differential voltage. The READP signal controls coupling of the full digital logic level to additional circuitry.

The single-stage differential current sense amplifier 1400 may be operated, in implementations of the subject matter of this disclosure, in each of four phases at different times, the phases including a pre-charge phase, pre-amplification phase, sensing phase, and delivery phase. The pre-charge phase includes charging nodes of the single-stage 1400—i.e., "DLC" and "DLT"—to the full digital logic level. The controller 1500 initializes the pre-charge phase according to "SAENP" and "SETNP" being set to the logic level '0'. The pre-amplification phase includes activating the one or more pass gates to enable the one or more current mirror, using the one or more current mirrors to discharge the pair of data lines to below the full digital logic level, and using the one or more current mirror to apply a differential voltage across the data lines "DLC" and "DLT." The controller initializes the pre-amplification phase according to "SAENP" being set to the logic level '1' and "SETNP" being set to the logic level '0.' The sensing phase includes converting the differential voltage to the full digital logic level. The controller initializes the sensing phase according to "SAENP" and "SETNP" being set to the logic level '1'. The delivery phase includes coupling the full digital logic level to additional circuitry. The controller initializes the delivery phase according to "SAENP" being set to the logic level '1' and "SETNP" being set to the logic level '1.'

Figure 16:
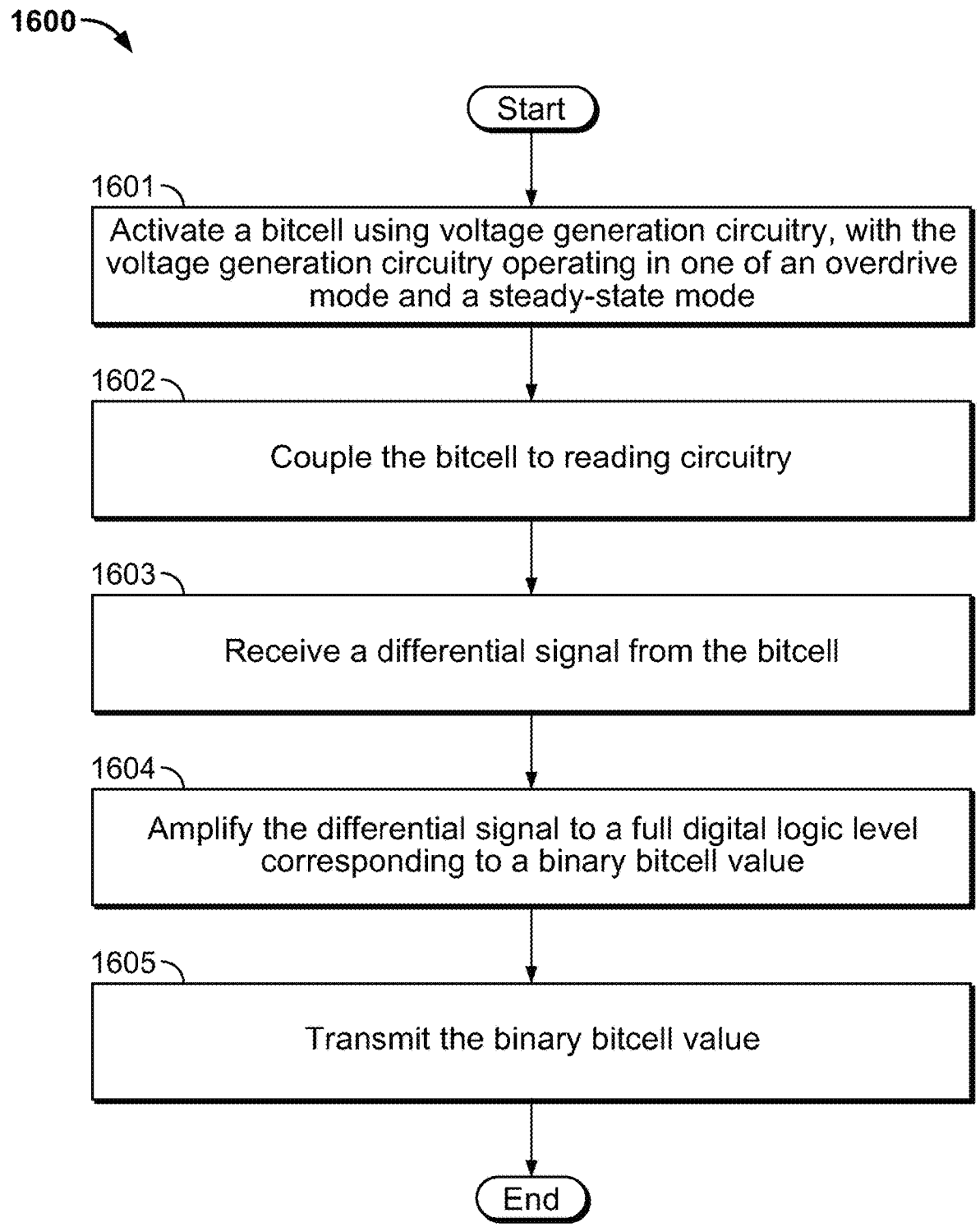
FIG. 16 is a flow diagram of a method in accordance with implementations of the subject matter of this disclosure of a method and apparatus for faster bitcell operation.

A method 1600 in accordance with implementations of the subject matter of this disclosure, for operating the architecture 100, is shown in FIG. 16. Method 1600 starts at 1601 where to a bitcell (e.g., FIGS. 8 and 9) is activated using voltage generation circuitry (e.g., FIGS. 3 and 4), with the voltage generation circuitry operating in one of an overdrive mode and a steady-state mode (e.g., as shown in FIG. 2). At 1602, the bitcell is coupled to reading circuitry (e.g., reading circuitry 104). At 1603, a differential signal is received from the bitcell. At 1604 differential signal is amplified to a full digital logic level corresponding to a binary bitcell value. At 1605, the binary bitcell value is transmitted and method 1600 ends.

Thus it is seen that an arrangement of semiconductor devices that exhibit faster bitcell operation and enables secure bitcell operation, and circuitry for executing faster bitcell operation and enabling secure bitcell operation, as well as methods of operation to execute faster bitcell operation and enable secure bitcell operation using the semiconductor devices and the circuitry, have been provided.

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A semiconductor device including circuitry configured for faster bitcell operation, the circuitry comprising:
a plurality of bitcells, each bitcell being readable as one of a '0' value and a '1' value and comprising a differential transistor pair comprising transistors with mismatched threshold voltages;
voltage generation circuitry configured to apply an activation voltage to activate selected bitcells in the plurality of bitcells for reading, the voltage generation circuitry being further configured to switch between an overdrive mode and a steady-state mode, wherein:
the voltage generation circuitry applies a first voltage during the overdrive mode, and
the voltage generation circuitry applies a second voltage, less than the first voltage, during the steady-state mode;
interconnect circuitry configured to couple the plurality of bitcells to reading circuitry; and
reading circuitry configured to receive a differential signal from a bitcell and amplify the differential signal to a full digital logic level, wherein:
the full digital logic level corresponds to one of the '0' value and the '1' value.

2. The semiconductor device of claim 1, wherein:
a first transistor of the differential transistor pair has a first threshold voltage and a second transistor of the differential transistor pair has a second threshold voltage, less than the first threshold voltage.

3. The semiconductor device of claim 2, wherein:
the threshold voltage of the first transistor exceeds the threshold voltage of the second transistor by a differential threshold voltage magnitude;
the differential threshold voltage magnitude is larger than a threshold voltage variation, due to process, voltage, or temperature variation, or device aging, of the first transistor and a threshold voltage variation, due to process, voltage, or temperature variation, or device aging, of the second transistor; and
the bitcell is configured to output a differential signal, the differential signal having a differential signal magnitude proportional to the differential threshold voltage magnitude.

4. The semiconductor device of claim 3, wherein:
the differential threshold voltage magnitude is at least twice the magnitude of an outlier threshold voltage variation; and
the outlier threshold voltage variation is equal to four times a standard deviation of a threshold voltage variation, due to process, voltage or temperature variation, or device aging.

5. The semiconductor device of claim 2, wherein each bitcell outputs a first current profile when readable as the '0' value and a second current profile when readable as the '1' value, the first current profile being identical to the second current profile.

6. The semiconductor device of claim 2, wherein a layout of the first transistor is visually identical to a layout of the second transistor.

7. The semiconductor device of claim 1, wherein the voltage generation circuitry comprises at least one transistor configurable to provide the first voltage during the overdrive mode.

8. The semiconductor device of claim 1, wherein:
the voltage generation circuitry comprises at least one transistor;
the transistor is configurable to divide a full power supply voltage to a selectable fraction of the full power supply voltage; and
the transistor provides the selectable fraction of the full power supply voltage as the second voltage during the steady-state mode.

9. The semiconductor device of claim 1, wherein the interconnect circuitry comprises a plurality of bit switch circuits, each bit switch circuit in the plurality of bit switch circuits being configured to couple a respective bitcell signal from a higher-loss path to a lower-loss path.

10. The semiconductor device of claim 1, wherein the interconnect circuitry comprises a plurality of bit switches, each bit switch being coupled to an array of bitcells, and each respective bit switch being located in a respective geometric position that minimizes average distance between the respective bit switch and bitcells coupled to the respective bit switch.

11. The semiconductor device of claim 1, wherein:
the reading circuitry is a differential current sense amplifier;
the sense amplifier comprises a two-stage circuit;
transistors of a first stage of the two-stage circuit create a differential voltage on a pair of data lines;

transistors of the first stage further couple to a second stage of the two-stage circuit by outputting a low voltage signal;

transistors of the second stage of the two-stage circuit drive the sense amplifier to the full digital logic level; and transistors of the second stage of the two-stage circuit further couple the sense amplifier to additional circuitry.

12. The semiconductor device of claim 1, wherein:

the reading circuitry comprises a single-stage differential current sense amplifier;

transistors of the single stage are configured to implement at least one pass gate;

transistors of the single stage are further configured to implement at least one mirror diode, pass gates of the at least one pass gate being configurable to control the at least one mirror diode, and mirror diodes of the at least one mirror diode creating a differential voltage on a pair of data lines;

transistors of the single stage are further configured to convert the differential voltage to the full digital logic level; and transistors of the single stage are further configured to couple the sense amplifier to additional circuitry.

13. A method for rapid operation of a bitcell array, the bitcell array comprising a plurality of bitcells, each bitcell comprising a differential pair of transistors in which the transistors have mismatched threshold voltages, and being readable as one of a '0' value and a '1' value; the method comprising:

activating bitcells in the plurality of bitcells using voltage generation circuitry, wherein:
 a first voltage is applied during an overdrive mode, and
 a second voltage, less than the first voltage, is applied during a steady-state mode;

coupling the bitcells to reading circuitry using interconnect circuitry;

receiving the differential signal using the reading circuitry; and amplifying the differential signal to a full digital logic level using the reading circuitry.

14. The method of claim 13, further comprising:

applying a single activation voltage to a first transistor of the transistors that have mismatched threshold voltages and a second transistor of the transistors that have mismatched threshold voltages; wherein:

the single activation voltage induces a first signal in the first transistor and a second signal in the second transistor; and the first signal is stronger than the second signal by a magnitude.

15. The method of claim 14, further comprising:

amplifying the differential signal during a processing time, the processing time having a duration that is inversely proportional to the magnitude by which the first signal is stronger than the second signal.

16. The method of claim 14, further comprising:

activating a bitcell that is readable as the '0' value to provide a first current profile; and activating a bitcell that is readable as the '1' value to provide a second current profile, the second current profile being identical to the first current profile.

17. The method of claim 13, further comprising providing the first voltage during the overdrive mode using at least one transistor within the voltage generation circuitry.

18. The method of claim 13, further comprising:

dividing a full power supply voltage to a selectable fraction of the full power supply voltage using at least one transistor within the voltage generation circuitry; and providing the selectable fraction of the full power supply voltage as the second voltage during the steady-state mode.

19. The method of claim 13, further comprising routing a respective bitcell signal from a higher-loss path to a lower-loss path using the interconnect circuitry.

20. The method of claim 13, further comprising:

reading the bitcell signal using a two-stage differential current sense amplifier having a first stage and a second stage; and operating the sense amplifier in each of three phases at different times, the phases including a pre-charge phase, pre-amplification phase, and decision phase, wherein:

the pre-charge phase charges nodes of the first stage and the second stage up to the full digital logic level;

the pre-amplification phase applies a differential voltage between a pair of data lines;

the decision phase amplifies the differential voltage by pulling one data line in the pair of data lines to a zero voltage state, using the first stage;

the decision phase further couples a signal from the first stage to the second stage;

the decision phase further converts the differential voltage to the full digital logic level, using the second stage; and the decision phase further couples the reading circuitry to additional circuitry, using the second stage.

21. The method of claim 13, further comprising:

reading the bitcell signal using a single-stage differential current sense amplifier; and operating the sense amplifier in each of four phases at different times, the phases including a pre-charge phase, pre-amplification phase, sensing phase, and delivery phase, wherein:

the pre-charge phase charges up a pair of data lines up to the full digital logic level;

the pre-amplification phase activates one or more pass gates to enable one or more current mirrors;

the pre-amplification phase discharges the pair of data lines to below the full digital logic level;

the pre-amplification phase further applies a differential voltage to one data line of the pair of data lines discharged to below the full digital logic level;

the sensing phase converts the differential voltage to the full digital logic level; and the delivery phase couples the reading circuitry to additional circuitry.

* * * * *